US010923384B2

(12) United States Patent
Kong et al.

(10) Patent No.: US 10,923,384 B2
(45) Date of Patent: Feb. 16, 2021

(54) TRANSFER ROBOT AND APPARATUS FOR TREATING SUBSTRATE WITH THE ROBOT

(71) Applicant: SEMES CO., LTD., Chungcheongnam-do (KR)

(72) Inventors: Tae Kyung Kong, Cheonan-si (KR); Ki Won Han, Anseong-si (KR); Min Je Lee, Daegu (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 16/578,955

(22) Filed: Sep. 23, 2019

(65) Prior Publication Data

US 2020/0105571 A1 Apr. 2, 2020

(30) Foreign Application Priority Data

Sep. 27, 2018 (KR) .......................... 10-2018-0115115

(51) Int. Cl.
*H01L 21/683* (2006.01)
*H01L 21/677* (2006.01)
*H01L 21/687* (2006.01)
*B25J 15/06* (2006.01)

(52) U.S. Cl.
CPC ...... *H01L 21/6838* (2013.01); *B25J 15/0616* (2013.01); *H01L 21/67766* (2013.01); *H01L 21/68728* (2013.01)

(58) Field of Classification Search
CPC ... B25J 15/0625; B25J 17/0241; F16B 5/0621

USPC .................................. 294/213, 183; 414/941
See application file for complete search history.

(56) References Cited

U.S. PATENT DOCUMENTS

| 6,499,777 B1 * | 12/2002 | Wang ..................... C30B 35/005 |
| | | 118/728 |
| 8,764,085 B2 * | 7/2014 | Urabe ............... H01L 21/68707 |
| | | 294/103.1 |
| 8,991,887 B2 * | 3/2015 | Shin .................. H01L 21/67742 |
| | | 294/183 |
| 10,553,472 B2 * | 2/2020 | Bosboom .......... H01L 21/68707 |
| 2003/0234548 A1 * | 12/2003 | Aggarwal ............. B25B 11/007 |
| | | 294/188 |

(Continued)

FOREIGN PATENT DOCUMENTS

JP 2014-118250 A 6/2014
KR 10-1999-0017355 A 3/1999
(Continued)

*Primary Examiner* — Paul T Chin
(74) *Attorney, Agent, or Firm* — Li & Cai Intellectual Property (USA) Office

(57) ABSTRACT

An apparatus for transferring a substrate includes a hand on which the substrate is placed, and the hand includes an outer support member that supports a first region of the substrate and has a pair of outer fingers, an inner support member that supports a second region of the substrate that is closer to the center of the substrate than the first region, the inner support member having a pair of inner fingers located inward of the pair of outer fingers, and a central recess formed in a region between the pair of inner fingers of the inner support member, the region corresponding to the center of the substrate placed on the hand and the central recess being open toward a front side.

11 Claims, 9 Drawing Sheets

(56) References Cited

U.S. PATENT DOCUMENTS

| | | | | |
|---|---|---|---|---|
| 2006/0113806 A1* | 6/2006 | Tsuji | ................ | H01L 21/68707 294/213 |
| 2009/0096229 A1* | 4/2009 | Bonora | ............... | H01L 21/6838 294/188 |
| 2010/0290886 A1* | 11/2010 | Hashimoto | .......... | B25J 15/0014 414/800 |
| 2011/0241367 A1* | 10/2011 | Hosek | ............... | H01L 21/68707 294/213 |
| 2012/0049555 A1* | 3/2012 | Fujii | ................ | H01L 21/68707 294/213 |
| 2013/0193703 A1* | 8/2013 | Ando | ................ | H01L 21/68707 294/213 |
| 2013/0341946 A1* | 12/2013 | Yamanaka | ............. | B25J 15/008 294/213 |
| 2014/0227045 A1* | 8/2014 | Iwasaka | ............ | H01L 21/68728 406/88 |
| 2014/0306474 A1* | 10/2014 | Schrameyer | ......... | B25J 15/0014 294/213 |
| 2015/0086316 A1* | 3/2015 | Greenberg | ........... | B25J 15/0052 414/752.1 |
| 2018/0161989 A1* | 6/2018 | Bosboom | ............. | B25J 11/0095 |

FOREIGN PATENT DOCUMENTS

| | | |
|---|---|---|
| KR | 10-2007-0080510 A | 8/2007 |
| KR | 10-1076398 B | 10/2011 |
| KR | 10-2015-0103316 A | 9/2015 |
| KR | 10-1741080 B | 5/2017 |
| KR | 10-1757819 B | 7/2017 |

\* cited by examiner

TRANSFER ROBOT AND APPARATUS FOR TREATING SUBSTRATE WITH THE ROBOT

CROSS-REFERENCE TO RELATED APPLICATIONS

A claim for priority under 35 U.S.C. § 119 is made to Korean Patent Application No. 10-2018-0115115 filed on Sep. 27, 2018, in the Korean Intellectual Property Office, the entire contents of which are hereby incorporated by reference.

BACKGROUND

Embodiments of the inventive concept described herein relate to an apparatus for treating a substrate.

In general, semiconductor devices are manufactured through various processes such as an ion implantation process, a film deposition process, a diffusion process, a photolithography process, and the like. Among these processes, the photolithography process for forming a desired pattern on a wafer is a process of forming a predetermined pattern on a wafer in order to selectively define a portion to be subjected to etching or ion implantation and a portion to be protected. The photolithography process includes a coating process, an exposing process, and a developing process. The coating process is a process of forming a photoresist layer to a predetermined thickness on a wafer by dispensing photoresist onto the wafer and then spinning the wafer at high speed. The exposing process is a process of printing a mask or reticle pattern on the wafer by aligning the wafer having the photoresist layer formed thereon and a mask and then exposing the photoresist layer formed on the wafer to light, such as ultraviolet light, through the mask. The developing process is a process of forming a desired photoresist pattern by developing the photoresist layer subjected to the exposing process.

In addition, the photolithography process further includes a bake process of baking the wafer at a predetermined temperature. The bake process includes a pre-bake process of removing moisture from the wafer before the coating process, a soft bake process of sticking the photoresist layer to the wafer surface by drying the photoresist layer after coating the wafer with the photoresist, a post-exposure bake process of heating the photoresist layer after the exposing process, and a hard bake process of firmly attaching the pattern formed by the developing process to the wafer.

An index robot used in an apparatus for performing the photolithography process mainly uses a U-shaped hand that has vacuum pads for clamping a substrate by vacuum pressure and a wide recess cut into the hand to avoid interference with a counterpart object, in which the vacuum pads have a wide gap therebetween. However, the hand in the related art has a problem in that the gap between the vacuum pads is wide so that a grip on a warped substrate is unstable.

SUMMARY

Embodiments of the inventive concept provide a substrate transfer robot for stably transferring a warped substrate, and a substrate treating apparatus including the same.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for transferring a substrate includes a hand on which the substrate is placed, and the hand includes an outer support member that supports a first region of the substrate and has a pair of outer fingers, an inner support member that supports a second region of the substrate that is closer to the center of the substrate than the first region, the inner support member having a pair of inner fingers located inward of the pair of outer fingers, and a central recess formed in a region between the pair of inner fingers of the inner support member, the region corresponding to the center of the substrate placed on the hand and the central recess being open toward a front side.

The apparatus may further include a vacuum clamping member that clamps the substrate by vacuum pressure. The vacuum clamping member may include first vacuum pads formed on the pair of inner fingers, respectively, and a second vacuum pad formed on the inner support member, the second vacuum pad being located on a rear of the central recess.

The first vacuum pads and the second vacuum pad may be provided on a concentric circle with respect to the central recess.

The pair of outer fingers may further protrude forward beyond the pair of inner fingers.

Guide recesses may be formed between the pair of outer fingers and the pair of inner fingers to prevent interference with a support pins of an external transfer location when the hand moves toward the support pins for transfer of the substrate.

The first vacuum pads and the second vacuum pad may be located in a radius of rotation that is smaller than a radius of rotation in which the support pins are located.

The pair of outer fingers may include, on distal end portions thereof, deviation prevention stoppers that prevent deviation of the substrate.

According to an exemplary embodiment, a hand of an apparatus for transferring a substrate includes a fixed end portion attached to the apparatus and a support portion having a plurality of fingers that extend from the fixed end portion and support the substrate. The support portion includes a central recess in the center thereof that corresponds to the center of the substrate, the central recess being open toward a front side.

The plurality of fingers may include a pair of outer fingers and a pair of inner fingers located inward of the pair of outer fingers.

The pair of outer fingers may be longer than the pair of inner fingers.

The support portion may further include guide recesses formed between the pair of outer fingers and the pair of inner fingers to prevent interference with a support pins of an external transfer location when the hand moves toward the support pins for transfer of the substrate.

The hand may further include first vacuum pads formed on the pair of inner fingers, respectively, and a second vacuum pad formed on a rear of the central recess.

The first vacuum pads and the second vacuum pad may be provided on the same circle with respect to the central recess.

According to an exemplary embodiment, an apparatus for treating a substrate includes a load port on which a cassette is located, an external buffer module having support pins for transfer of the substrate, and an index robot that transfers the substrate between the load port and the buffer module. The index robot has a hand that includes an outer support member that supports a first region of the substrate and has a pair of outer fingers, an inner support member that supports a second region of the substrate that is closer to the center of the substrate than the first region, the inner support member having a pair of inner fingers located inward of the pair of outer fingers, and a central recess formed in a region between the pair of inner fingers of the inner support member, the region corresponding to the center of the substrate placed on the hand and the central recess being open toward a front side.

The hand may further include first vacuum pads formed on the pair of inner fingers, respectively, and a second vacuum pad formed on the inner support member, the second vacuum pad being located behind the central recess. The first vacuum pads and the second vacuum pad may be provided on a concentric circle with respect to the central recess.

The hand may further include guide recesses formed between the pair of outer fingers and the pair of inner fingers to prevent interference with the support pins.

The pair of outer fingers may be longer than the pair of inner fingers.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
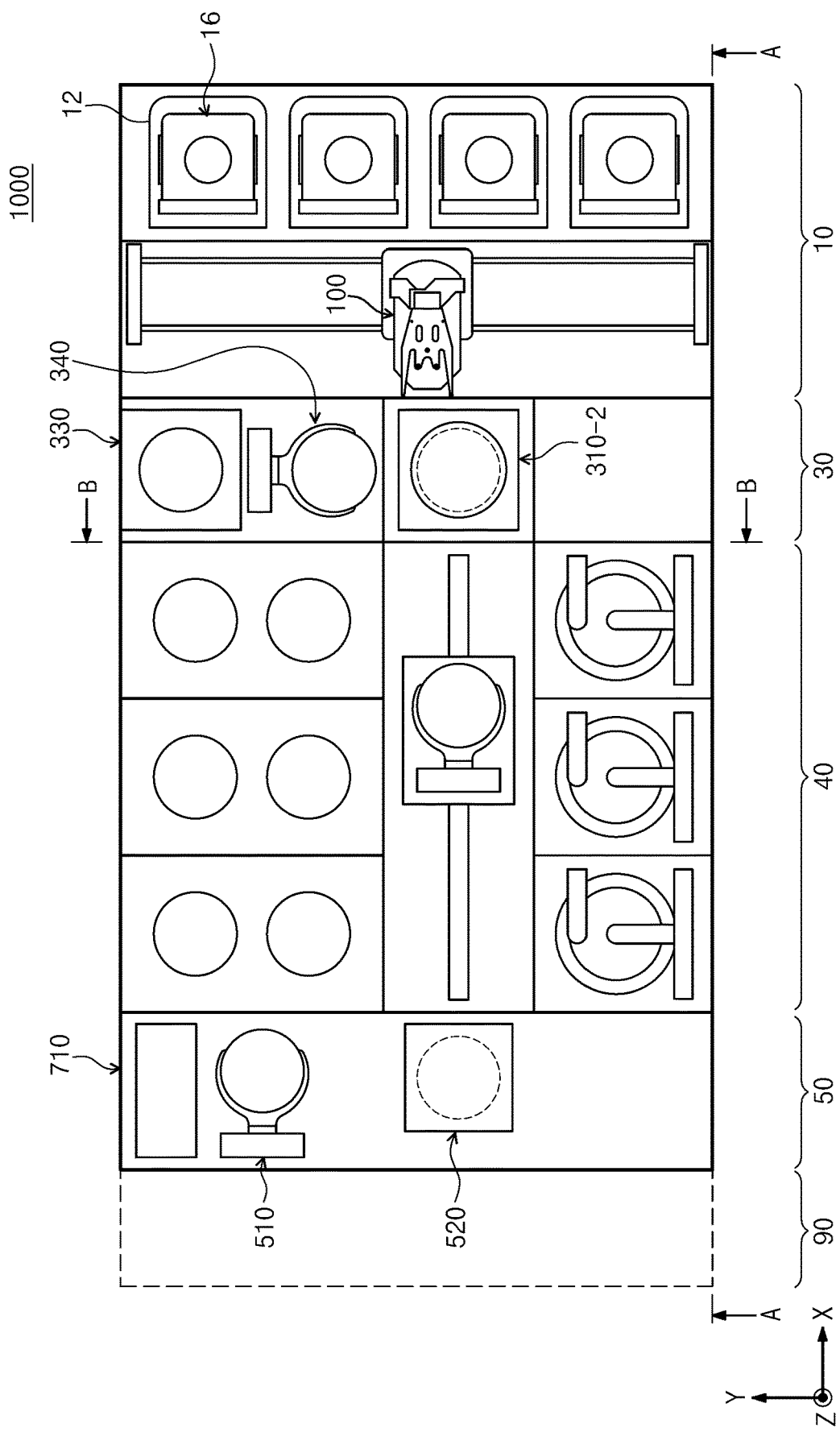
FIG. 1 is a plan view illustrating a substrate treating apparatus according to an embodiment of the inventive concept.

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

Figure 2:
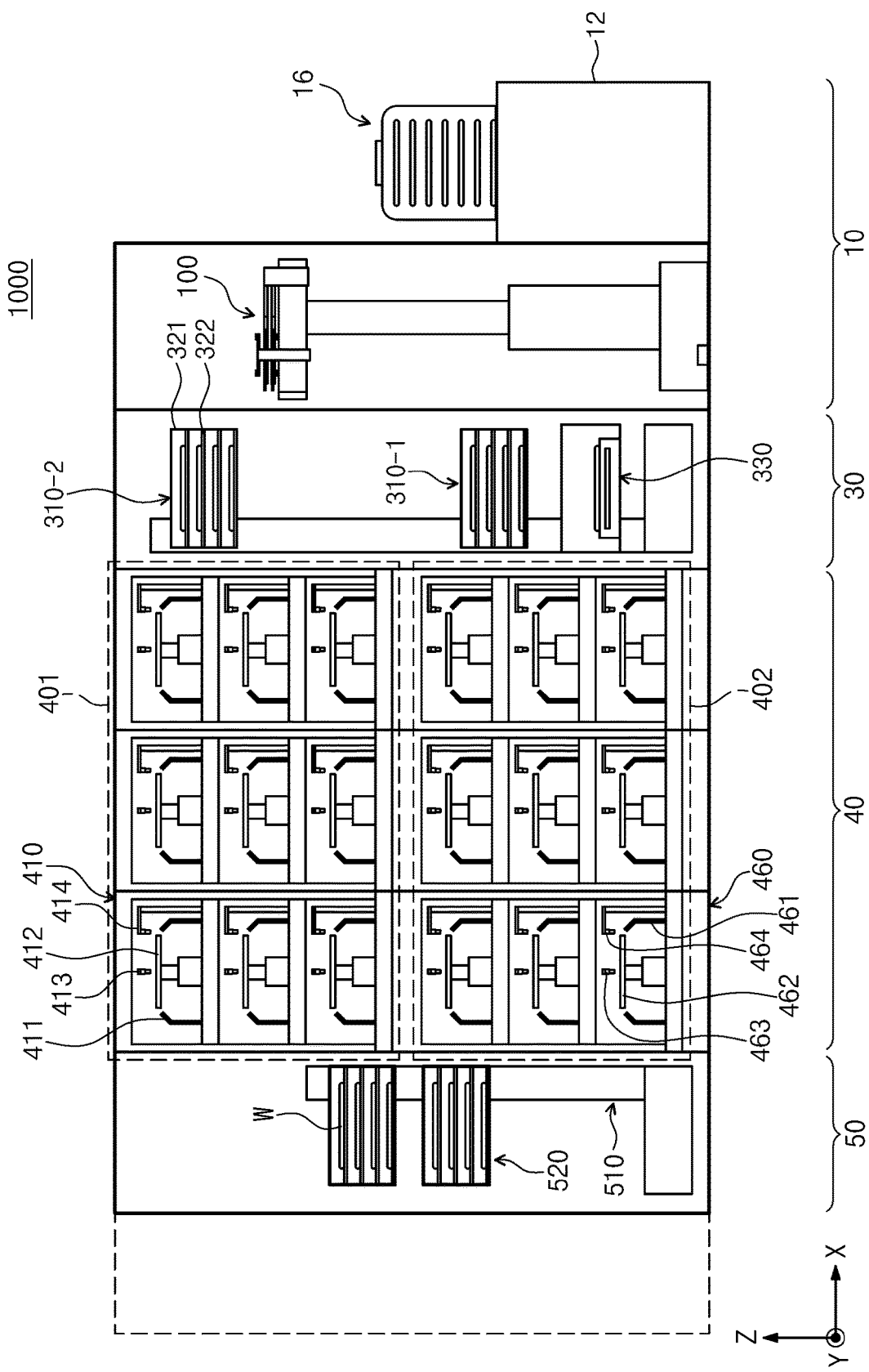
FIG. 2 is a view illustrating the substrate treating apparatus of FIG. 1 when viewed in direction A-A.
Figure 3:
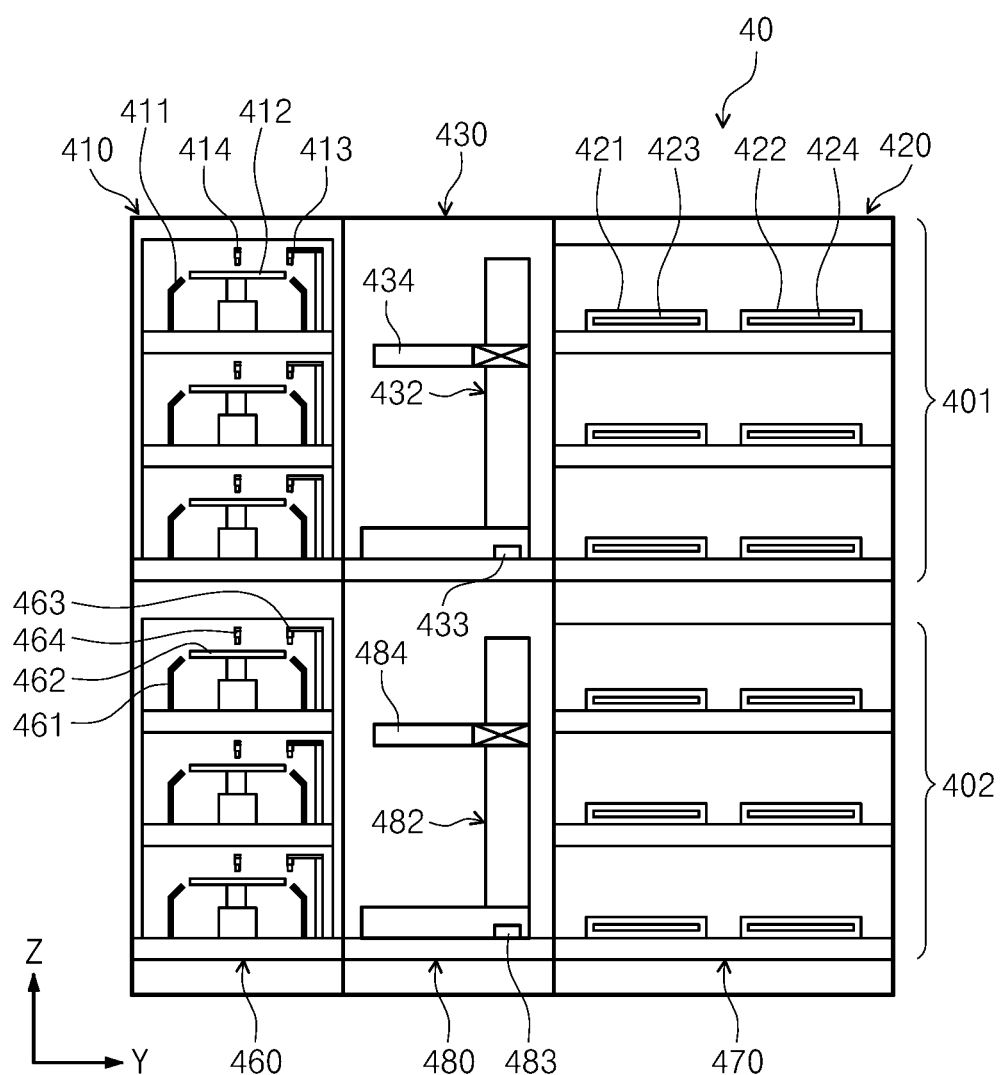
FIG. 3 is a view illustrating the substrate treating apparatus of FIG. 1 when viewed in direction B-B.

FIGS. 1 to 3 are schematic views illustrating a substrate treating apparatus 1000 according to an embodiment of the inventive concept. FIG. 1 is a top view of the substrate treating apparatus 1000, FIG. 2 is a view illustrating the substrate treating apparatus 1000 of FIG. 1 when viewed in direction A-A, and FIG. 3 is a view illustrating the substrate treating apparatus 1000 of FIG. 1 when viewed in direction B-B.

Referring to FIGS. 1 to 3, the substrate treating apparatus 1000 may include an index unit 10, a process unit 40, a buffer unit 30, and an interface unit 50.

The index unit 10, the buffer unit 30, the process unit 40, and the interface unit 50 may be arranged in a row. Hereinafter, the direction in which the index unit 10, the buffer unit 30, the process unit 40, and the interface unit 50 are arranged is defined as a first direction X, a direction perpendicular to the first direction X when viewed from above is defined as a second direction Y, and a direction perpendicular to the plane including the first direction X and the second direction Y is defined as a third direction Z.

Substrates W are moved in the state of being received in carriers 16. The carriers 16 have a structure sealed from the outside. For example, front open unified pods (FOUPs), each of which has a door at the front thereof, may be used as the carriers 16.

Hereinafter, the aforementioned components will be described in detail with reference to FIGS. 1 to 3.

(Index Unit)

The index unit 10 is disposed in the front of the substrate treating apparatus 1000 in the first direction X. For example, the index unit 10 may include four load ports 12 and one index robot 100.

The four load ports 12 are disposed in the front of the index unit 10 in the first direction X. The four load ports 12 are arranged along the second direction Y. The number of load ports 12 may be increased or decreased depending on the process efficiency and the footprint condition of the substrate treating apparatus 1000. The load ports 12 have the carriers 16 (e.g., cassettes, FOUPs, or the like) placed thereon, respectively, and substrates W to be treated or substrates W completely treated are received in each of the carriers 16.

The index robot 100 is disposed adjacent to the load ports 12 in the first direction X. The index robot 100 is installed between the load ports 12 and the buffer unit 30. The index robot 100 transfers substrates W between the load ports 12 and a transfer location of the buffer unit 30 that has support pins for transfer of the substrates W. The transfer location of the buffer unit 30 may be a buffer module of the buffer unit 30. The index robot 100 transfers substrates W standing by in the buffer module of the buffer unit 30 to the carriers 16, or transfers substrates W standing by in the carriers 16 to the buffer module of the buffer unit 30.

(Process Unit)

A process of coating a substrate W with photoresist before an exposing process and a process of developing the substrate W after the exposing process may be performed in the process unit 40.

The process unit 40 has a coating unit 401 and a developing unit 402. The coating unit 401 and the developing unit 402 may be disposed on different floors. According to an embodiment, the coating unit 401 may be located over the developing unit 402. However, the positions of the units and the types of process modules provided in the units may vary depending on the type of substrate to be treated and a treating process.

The coating unit 401 performs a process of coating a substrate W with a light-sensitive material such as photoresist and a heat treatment process such as heating or cooling the substrate W before and after the resist coating process. The coating unit 401 may include a resist coating chamber 410, a bake chamber 420, and a transfer chamber 430.

The resist coating chamber 410, the transfer chamber 430, and the bake chamber 420 may be sequentially arranged along the second direction Y. Accordingly, the resist coating chamber 410 and the bake chamber 420 may be spaced apart from each other in the second direction Y, with the transfer chamber 430 therebetween. A plurality of resist coating chambers 410 may be provided. The resist coating chambers 410 may be arranged in the first direction X and the third direction Z. Although the drawings illustrate an example that nine resist coating chambers 410 are provided, the inventive concept is not limited thereto. A plurality of bake chambers 420 may be provided. The bake chambers 420 may be arranged in the first direction X and the third direction Z. Although the drawings illustrate an example that six bake chambers 420 are provided, the inventive concept is not limited thereto.

The transfer chamber 430 is located side by side with a first buffer 320 of the buffer unit 30 in the first direction X. A coating unit robot 432 and a guide rail 433 are located in the transfer chamber 430. The transfer chamber 430 has a substantially rectangular shape. The coating unit robot 432 transfers substrates W between the bake chambers 420, the resist coating chambers 410, the first buffer 320 of the buffer unit 30, and a first cooling chamber 520 of a second buffer module 500 that will be described below. The guide rail 433 is arranged such that the lengthwise direction thereof is parallel to the first direction X. The guide rail 433 guides the coating unit robot 432 such that the coating unit robot 432 rectilinearly moves in the first direction X. The coating unit robot 432 may include a hand 434. The hand 434 may have the same form as a first hand of a buffer transfer robot 340.

The resist coating chambers 410 all have the same structure. However, the types of photoresists used in the respective resist coating chambers 410 may differ from one another. For example, chemical amplification resist may be used as photoresist. Each of the resist coating chambers 410 coats a substrate W with photoresist. The resist coating chamber 410 has a housing 411, a support plate 412, and a nozzle 413. The housing 411 has a cup shape with an open top. The support plate 412 is located in the housing 411 and supports the substrate W. The support plate 412 is provided so as to be rotatable. The nozzle 413 dispenses the photoresist onto the substrate W placed on the support plate 412. The nozzle 413 may have a circular tubular shape and may dispense the photoresist onto the center of the substrate W. Selectively, the nozzle 413 may have a length corresponding to the diameter of the substrate W, and a dispensing opening of the nozzle 413 may have a slit shape. Additionally, the resist coating chamber 410 may further include a nozzle 414 for dispensing a cleaning solution such as deionized water to clean the surface of the substrate W that is coated with the photoresist.

The bake chambers 420 perform heat treatment on the substrate W. For example, the bake chambers 420 perform a prebake process of removing organics or moisture on the surface of the substrate W by heating the substrate W to a predetermined temperature before coating the substrate W with the photoresist, a soft bake process performed after the substrate W is coated with the photoresist, and a cooling process of cooling the substrate W after the heating processes. Each of the bake chambers 420 has a cooling plate 421 and a heating plate 422. The cooling plate 421 includes a cooling means 423 such as cooling water or a thermoelectric element. Furthermore, the heating plate 422 includes a heating means 424 such as a heating wire or a thermoelectric element. The cooling plate 421 and the heating plate 422 may be provided in one bake chamber 420. Selectively, some of the bake chambers 420 may include only the cooling plate 421, and the other bake chambers 420 may include only the heating plate 422.

The developing unit 402 performs a developing process of removing part of the photoresist by dispensing a developing solution to obtain a pattern on the substrate W and a heat treatment process of heating or cooling the substrate W before or after the developing process. The developing unit 402 has a developing chamber 460, a bake chamber 470, and a transfer chamber 480. The developing chamber 460, the bake chamber 470, and the transfer chamber 480 are sequentially arranged along the second direction Y. Accordingly, the developing chamber 460 and the bake chamber 470 may be spaced apart from each other in the second direction Y, with the transfer chamber 480 therebetween. A plurality of developing chambers 460 may be provided. The developing chambers 460 may be arranged in the first direction X and the third direction Z. The drawings illustrate an example that six developing chambers 460 are provided. A plurality of bake chambers 470 may be provided. The bake chambers 470 may be arranged in the first direction X and the third direction Z. The drawings illustrate an example that six bake chambers 470 are provided. However, a larger number of bake chambers 470 may be provided.

The transfer chamber 480 is located side by side with a second buffer 330 of the buffer unit 30 in the first direction X. A developing unit robot 482 and a guide rail 483 are located in the transfer chamber 480. The transfer chamber 480 has a substantially rectangular shape. The developing unit robot 482 transfers the substrate W between the bake chambers 470, the developing chambers 460, the second buffer 330 and a cooling chamber 350 of the buffer unit 30, and a second cooling chamber 540 of the second buffer module 500. The guide rail 483 is arranged such that the lengthwise direction thereof is parallel to the first direction X. The guide rail 483 guides the developing unit robot 482 such that the developing unit robot 482 rectilinearly moves in the first direction X. The developing unit robot 482 includes a hand 484. The hand 484 may have the same form as the first hand of the buffer transfer robot 340.

The developing chambers 460 all have the same structure. However, the types of developing solutions used in the respective developing chambers 460 may differ from one another. The developing chambers 460 remove light-exposed regions of the photoresist on the substrate W. At this time, light-exposed regions of a protective film are also removed. Alternatively, depending on the type of photoresist used, only masked regions of the photoresist and the protective film may be removed.

Each of the developing chambers 460 has a housing 461, a support plate 462, and a nozzle 463. The housing 461 has a cup shape with an open top. The support plate 462 is located in the housing 461 and supports the substrate W. The support plate 462 is provided so as to be rotatable. The nozzle 463 dispenses a developing solution onto the substrate W placed on the support plate 462. The nozzle 463 may have a circular tubular shape and may dispense the developing solution onto the center of the substrate W. Selectively, the nozzle 463 may have a length corresponding to the diameter of the substrate W, and a dispensing opening of the nozzle 463 may have a slit shape. Additionally, the developing chamber 460 may further include a nozzle 464 for dispensing a cleaning solution such as deionized water to clean the surface of the substrate W onto which the developing solution is dispensed.

The bake chambers 470 perform heat treatment on the substrate W. For example, the bake chambers 470 perform a post bake process of heating the substrate W before the developing process is performed, a hard bake process of heating the substrate W after the developing process is performed, and a cooling process of cooling the substrate W after the bake processes. Each of the bake chambers 470 has a cooling plate 471 and a heating plate 472. The cooling plate 471 includes a cooling means 473 such as cooling water or a thermoelectric element. Furthermore, the heating plate 472 includes a heating means 474 such as a heating wire or a thermoelectric element. The cooling plate 471 and the heating plate 472 may be provided in one bake chamber 470. Selectively, some of the bake chambers 470 may include only the cooling plate 471, and the other bake chambers 470 may include only the heating plate 472.

As described above, the coating unit 401 and the developing unit 402 are separated from each other in the process unit 40. Furthermore, when viewed from above, the coating unit 401 and the developing unit 402 may have the same chamber arrangement.

(Interface Unit)

The interface unit 50 transfers the substrate W between the process unit 40 and a stepper 90. The interface unit 50 may include an interface robot 510 and buffer modules 520 in which the substrate W temporarily stands by.

(Buffer Unit)

Referring to FIGS. 1 to 3, the buffer unit 30 is located between the index unit 10 and the process unit 40. The buffer unit 30 may include a buffer module 310, a heat treatment module 330, and the buffer transfer robot 340.

The buffer module 310 may be disposed at a height (the same height) at which the index robot 100 of the index unit 10 is able to access the buffer module 310. For example, the buffer module 310 may include a first buffer module 310-1 and a second buffer module 310-2.

The first buffer module 310-1 may be disposed at a height (the same height) at which the index robot 100 of the index unit 10 is able to access the first buffer module 310-1, and the second buffer module 310-2 may be disposed at a height (the same height) at which the robot 432 of the coating unit 401 is able to access the second buffer module 310-2.

The first buffer module 310-1 and the second buffer module 310-2 may each temporarily store a plurality of substrates W. The first buffer module 310-1 and the second buffer module 310-2 may have the same configuration.

Figure 4:
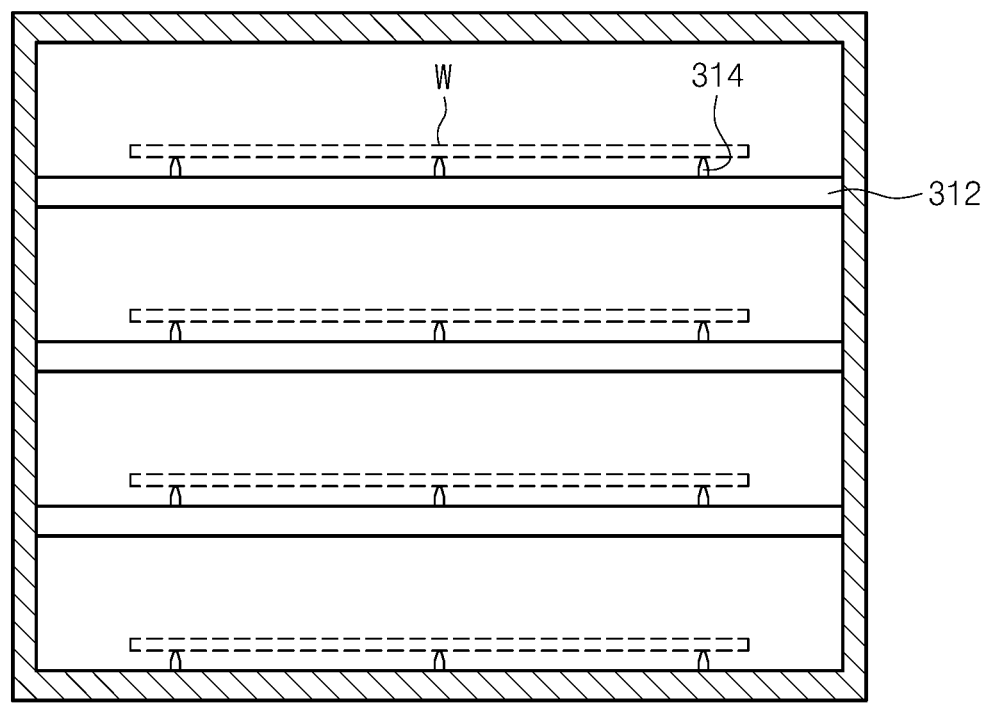
FIG. 4 is a view illustrating a first buffer module of FIG. 3.

FIG. 4 is a view illustrating the first buffer module.

Referring to FIG. 4, the first buffer module 310-1 may include base plates 312 and substrate support pins 314 of a fixed type. The base plates 312, each of which has the substrate support pins 314 installed thereon, may be stacked in layers.

Figure 5:
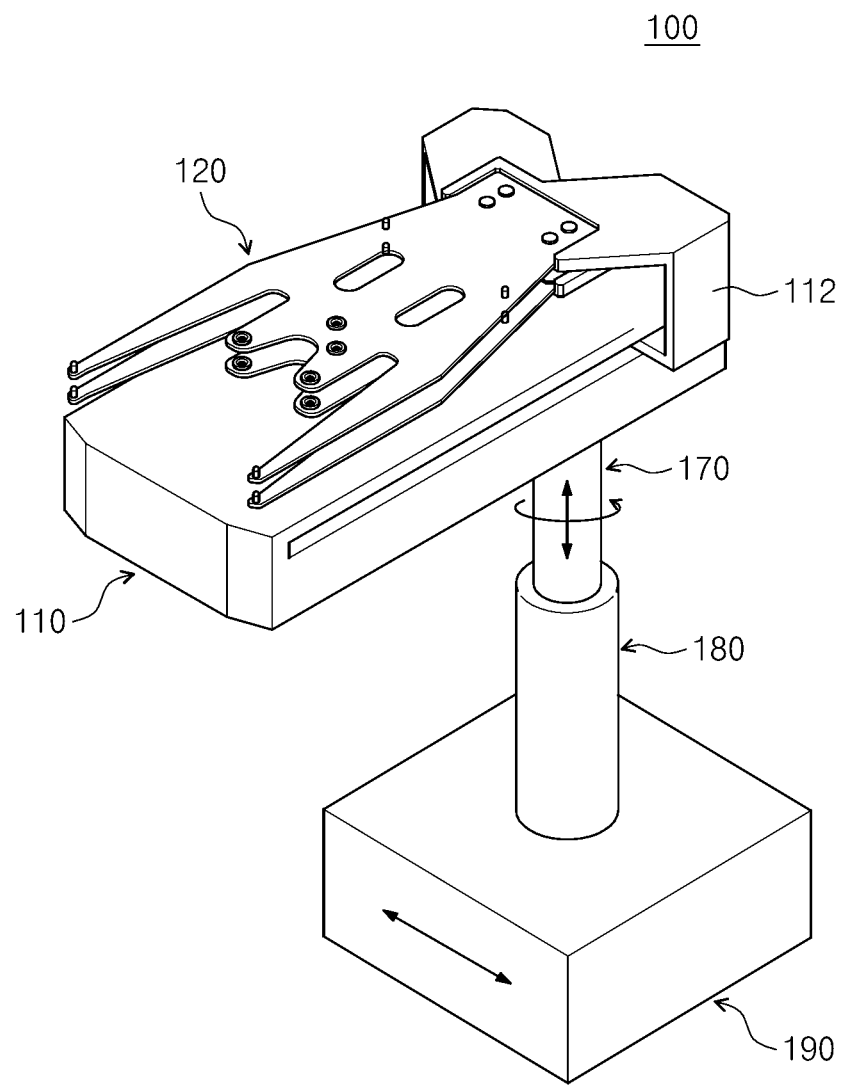
FIG. 5 is a perspective view illustrating an index robot of FIG. 1.
Figure 6:
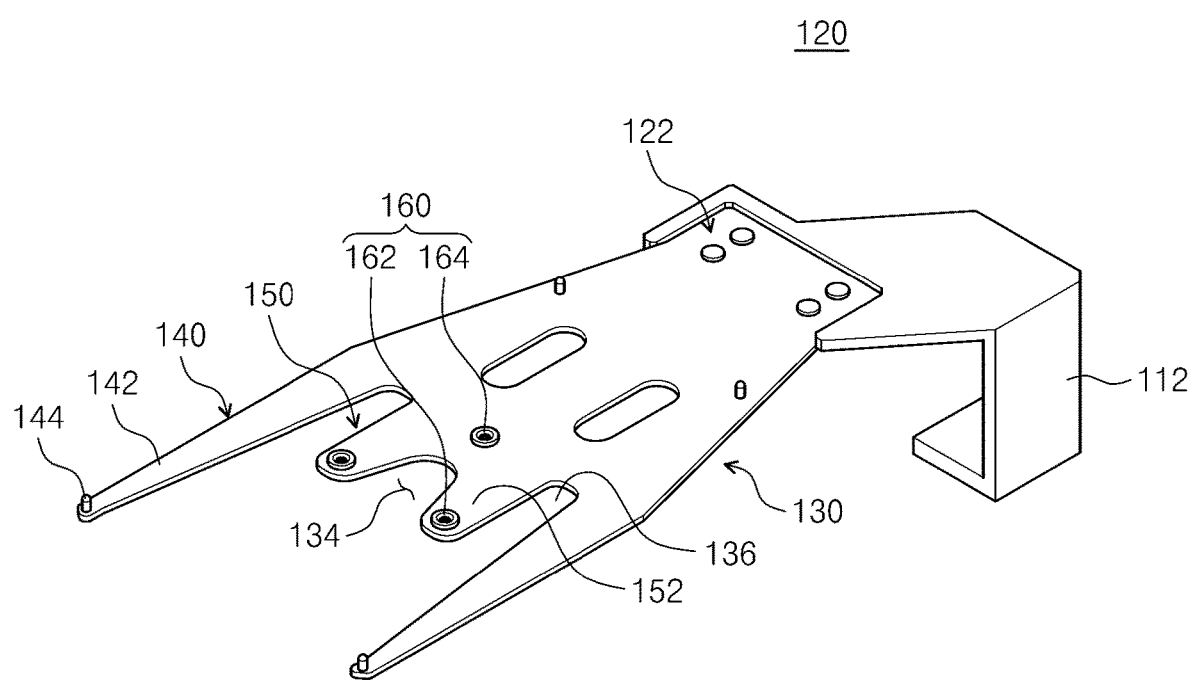
FIGS. 6 and 7 are a perspective view and a plan view illustrating a hand of FIG. 5.
Figure 7:
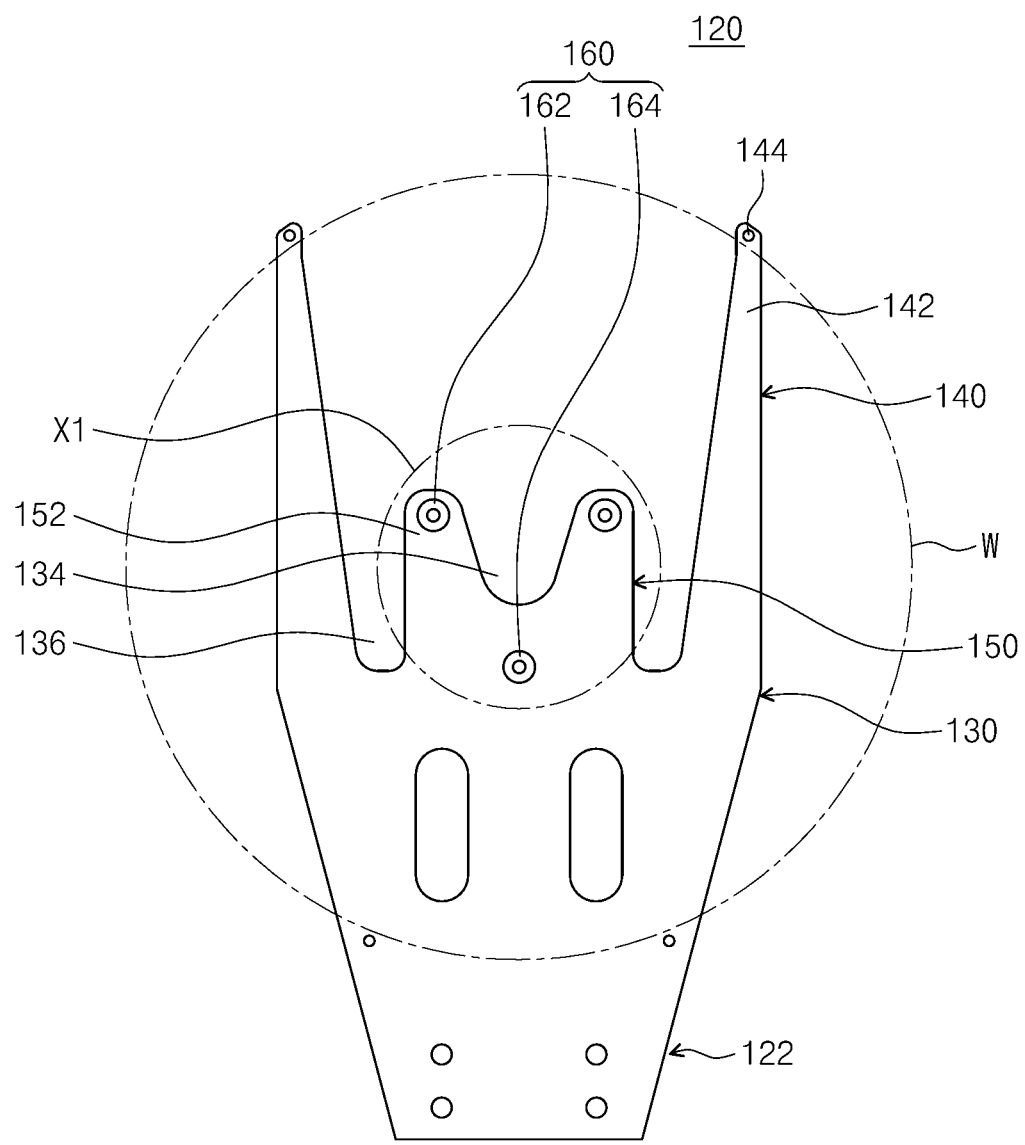

FIG. 5 is a perspective view illustrating the index robot of FIG. 1. FIGS. 6 and 7 are a perspective view and a plan view illustrating a hand of FIG. 5.

Referring to FIGS. 5 to 7, the index robot 100 may include may include a hand actuator 110, hands 120, a rotary part 170, a vertical movement part 180, and a horizontal movement part 190.

Specifically, the hand actuator 110 horizontally moves the hands 120, and the hands 120 are individually driven by the hand actuator 110. The hand actuator 110 includes a connecting arm 112 connected with an actuator (not illustrated) in the hand actuator 110, and the hands 112 are installed on an end portion of the connecting arm 112.

In this embodiment, the index robot 100 includes two hands 120. However, the number of hands 120 may be increased depending on the process efficiency of the substrate treating apparatus 1000.

The rotary part 170 is installed below the hand actuator 110. The rotary part 170 is combined with the hand actuator 110 and turns to rotate the hand actuator 110. Accordingly, the hands 120 rotate together. The vertical movement part 180 is installed below the rotary part 170, and the horizontal movement part 190 is installed below the vertical movement part 180. The vertical movement part 180 is combined with the rotary part 170 and raises or lowers the rotary part 170. Accordingly, the vertical positions of the hand actuator 110 and the hands 120 are adjusted.

In this embodiment, the hands 120 have the same configuration.

Each of the hands 120 may include a fixed end portion 122 and a support portion 130. The fixed end portion 122 may be fixed to the connecting arm 112 of the hand actuator 110. The support portion 230 may extend from the fixed end portion 122 and may include an outer support member 140 and an inner support member 150.

The outer support member 140 may support a first region of a substrate and may include a pair of outer fingers 142. The outer fingers 142 may further protrude forward beyond inner fingers 152. deviation prevention stoppers 144 for preventing deviation of the substrate may vertically protrude from distal end portions of the outer fingers 142, respectively. As used herein, the expression "support the substrate" does not mean that the fingers support the bottom of the substrate in the state of making direct contact with the bottom of the substrate, and portions of the hand that make contact with the bottom of the substrate may be vacuum clamping members.

The inner support member 150 may support a second region X1 (illustrated in FIG. 7) of the substrate that is closer to the center of the substrate than the first region of the substrate, and may include a pair of inner fingers 152 located inward of the pair of outer fingers 142.

A central recess 134 may be formed between the pair of inner fingers 152 of the inner support member 150. The central recess 134 may be formed in the region corresponding to the center of the substrate placed on the hand 120 and may be open toward the front side. When the substrate is placed on the hand 120, the center of the central recess 134 corresponds to the center of the substrate. The central recess 134 may be used in automatic teaching. For reference, the automatic teaching of the hand may be performed by a method in which a teaching jig recognizes the center of a lower structure through the central recess in the state in which the teaching jig in a wafer shape is placed on the hand.

The support portion 130 may include a vacuum clamping member 160 for clamping the substrate by vacuum pressure. The vacuum clamping member 160 may include first vacuum pads 162 formed on the pair of inner fingers 152 and a second vacuum pad 164 formed on the inner support member 150 so as to be located behind the central recess 134.

The first vacuum pads 162 and the second vacuum pad 164 may be closely provided on the concentric circle with respect to the central recess 134.

Figure 9:
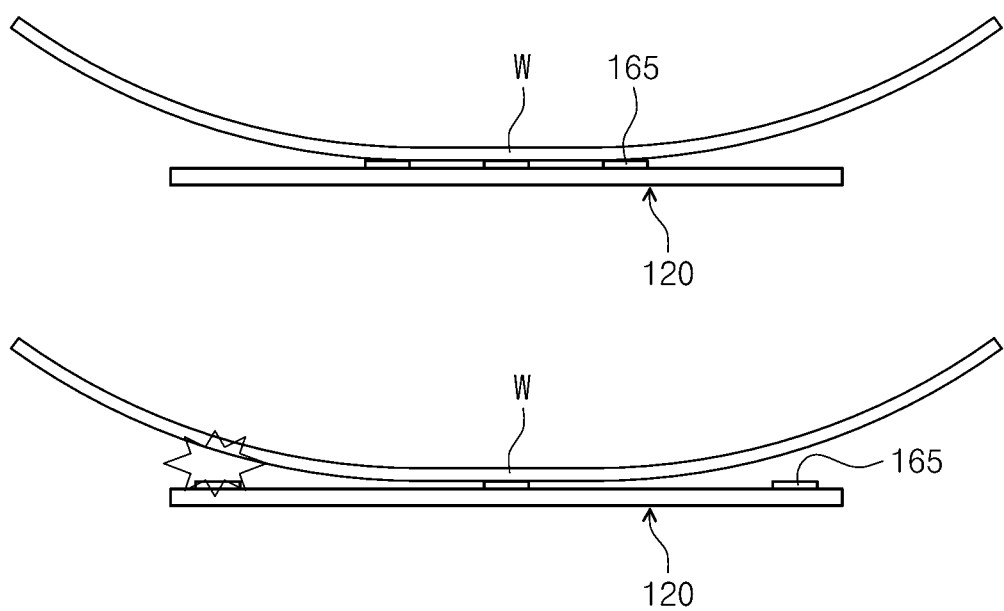
FIG. 9 is a view illustrating a change in the gap between vacuum pads with regard to a warped substrate.

FIG. 9 is a view illustrating a change in the gap between vacuum pads with regard to a warped substrate.

Referring to FIG. 9, when the gap between vacuum pads 165 is wide, a force holding a warped substrate may be weakened. Because the warped substrate becomes flatter toward the center from the edge thereof, the substrate may be more stably held when the gap between the vacuum pads 165 is narrow.

Figure 8:
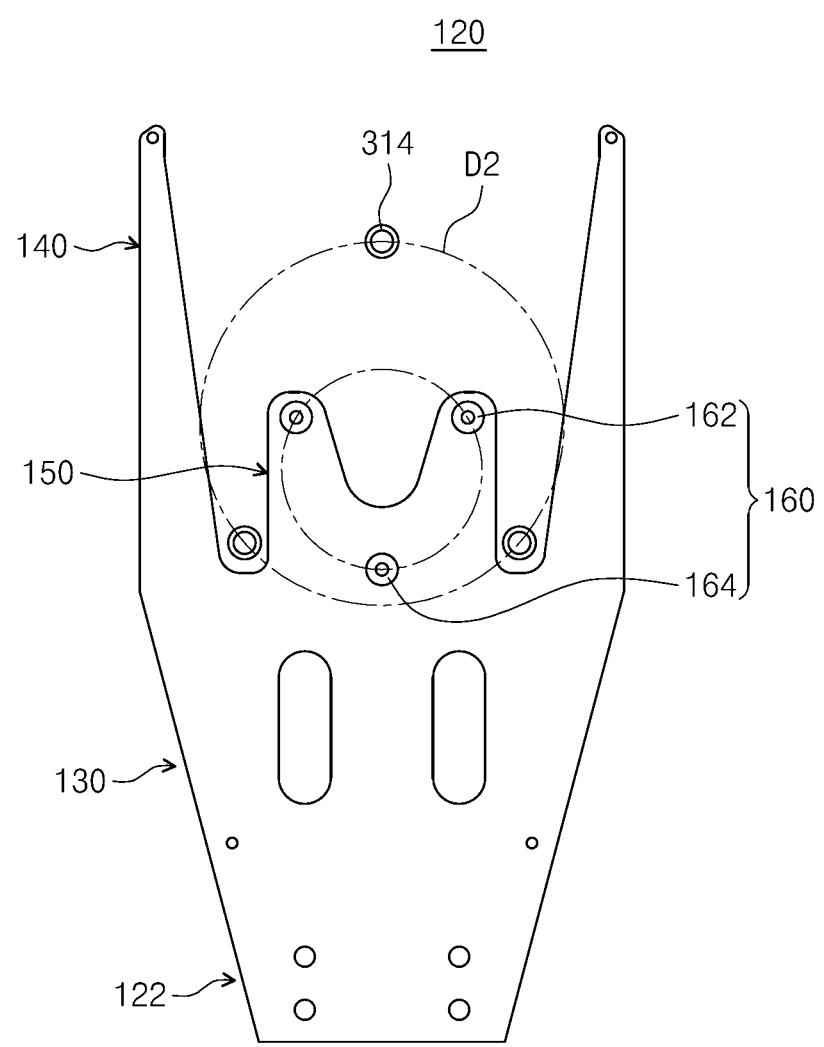
FIG. 8 is a view illustrating a position relationship between support pins and vacuum pads.

FIG. 8 is a view illustrating a position relationship between support pins and vacuum pads.

Referring to FIGS. 5 to 8, the support portion 130 has guide recesses 136. The guide recesses 136 may be formed between the pair of outer fingers 142 and the pair of inner fingers 152. The guide recesses 136 prevent interference with the support pins 314 when the hand 120 moves toward the buffer module (refer to FIG. 4) that has the support pins 134 for transfer of the substrate.

The pitch circle diameter (PCD) of the first and second vacuum pads 162 and 164 may preferably be smaller than the pitch circle diameter of the support pins 314. When the hand 120 is in a substrate pickup position in the buffer module 310, the first and second vacuum pads 162 and 164 may be located within a virtual radius of rotation (pitch circle D2) that connects the support pins 314.

For example, in the case where the pitch circle diameter of the first and second vacuum pads 162 and 164 is larger than the pitch circle diameter of the support pins 314, the following problem may be encountered. That is, if a substrate extracted from a carrier is placed in the buffer module in the state in which the vacuum pressure applied to the vacuum pads in the process of transferring the substrate to the buffer module 310 is not completely released, the substrate is inclined and not placed in a correct position. In a severe case, the substrate may be pulled out along with the hand.

However, in the case where the pitch circle diameter of the first and second vacuum pads 162 and 164 is smaller than the pitch circle diameter of the support pins 314 as in the inventive concept, even though the vacuum pressure applied to the vacuum pads 162 and 164 is not completely released, the support pins 314 may prevent, in advance, the substrate from being pulled out along the hand 12 because the support pins 314 are located outward of the vacuum pads 162 and 164.

According to the embodiments of the inventive concept, the vacuum pads have a narrow gap therebetween, thereby stably clamping a warped substrate.

Effects of the inventive concept are not limited to the above-described effects, and any other effects not mentioned herein may be clearly understood from this specification and the accompanying drawings by those skilled in the art to which the inventive concept pertains.

Hereinabove, although the inventive concept has been described with reference to exemplary embodiments and the accompanying drawings, the inventive concept is not limited thereto, but may be variously modified and altered by those skilled in the art to which the inventive concept pertains without departing from the spirit and scope of the inventive concept claimed in the following claims. Therefore, the exemplary embodiments of the inventive concept are provided to explain the spirit and scope of the inventive concept, but not to limit them, so that the spirit and scope of the inventive concept is not limited by the embodiments. The scope of the inventive concept should be construed on the basis of the accompanying claims, and all the technical ideas within the scope equivalent to the claims should be included in the scope of the inventive concept.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for transferring a substrate, the apparatus comprising:
a hand on which the substrate is placed,
wherein the hand includes:
an outer support member configured to support a first region of the substrate, the outer support member having a pair of outer fingers;
an inner support member configured to support a second region of the substrate that is closer to the center of the substrate than the first region, the inner support member having a pair of inner fingers located inward of the pair of outer fingers;
a central recess formed in a region between the pair of inner fingers of the inner support member, the region corresponding to the center of the substrate placed on the hand, wherein the central recess is open toward a front side,
a vacuum clamping member configured to clamp the substrate by vacuum pressure, wherein the vacuum clamping member includes:
first vacuum pads formed on each end of the pair of inner fingers, respectively; and
a second vacuum pad formed on the inner support member, the second vacuum pad being located on a rear of the central recess, and
wherein the pair of outer fingers further protrude forward beyond the pair of inner fingers, and
wherein the first vacuum pads and the second vacuum pad are located in a radius of rotation that is smaller than a radius of rotation in which support pins are located.

2. The apparatus of claim 1, wherein the first vacuum pads and the second vacuum pad are provided on a concentric circle with respect to the central recess.

3. The apparatus of claim 2, wherein guide recesses are formed between the pair of outer fingers and the pair of inner fingers to prevent interference with the support pins of an external transfer location when the hand moves toward the support pins for transfer of the substrate.

4. The apparatus of claim 1, wherein the pair of outer fingers include, on distal end portions thereof, deviation prevention stoppers configured to prevent deviation of the substrate.

5. A hand of an apparatus for transferring a substrate, the hand comprising:
a fixed end portion attached to the apparatus; and
a support portion having a plurality of fingers that extend from the fixed end portion and support the substrate, first vacuum pads formed on each end of the pair of inner fingers, respectively; and a second vacuum pad, wherein the support portion includes a central recess in the center thereof that corresponds to the center of the substrate, the central recess being open toward a front side, wherein the second vacuum pad is formed on a rear of the central recess, wherein the plurality of fingers include:
a pair of outer fingers; and
a pair of inner fingers located inward of the pair of outer fingers, and wherein the pair of outer fingers are longer than the pair of inner fingers, and wherein the first vacuum pads and the second vacuum pad are located in a radius of rotation that is smaller than a radius of rotation in which support pins of an external transfer location are located.

6. The hand of claim 5, wherein the pair of outer fingers are longer than the pair of inner fingers.

7. The hand of claim 5, wherein the support portion further includes:
guide recesses formed between the pair of outer fingers and the pair of inner fingers to prevent interference with the support pins of the external transfer location when the hand moves toward the support pins for transfer of the substrate.

8. The hand of claim 5, wherein the first vacuum pads and the second vacuum pad are provided on a concentric circle with respect to the central recess.

9. An apparatus for treating a substrate, the apparatus comprising:
a load port on which a cassette is located;
an external buffer module having support pins for transfer of the substrate; and
an index robot configured to transfer the substrate between the load port and the buffer module, wherein the index robot has a hand including:
an outer support member configured to support a first region of the substrate, the outer support member having a pair of outer fingers;
an inner support member configured to support a second region of the substrate that is closer to the center of the substrate than the first region, the inner support member having a pair of inner fingers located inward of the pair of outer fingers; and
a central recess formed in a region between the pair of inner fingers of the inner support member, the region corresponding to the center of the substrate placed on the hand, wherein the central recess is open toward a front side, first vacuum pads formed on each end of the pair of inner fingers, respectively; and a second vacuum pad formed on the inner support member, the second vacuum pad being located behind the central recess, wherein the pair of outer fingers are longer than the pair of inner fingers, and wherein the first vacuum pads and the second vacuum pad are located in a radius of rotation that is smaller than a radius of rotation in which the support pins of an external transfer location are located.

10. The apparatus of claim 9,
wherein the first vacuum pads and the second vacuum pad are provided on a concentric circle with respect to the central recess.

11. The apparatus of claim 9, wherein the hand further includes:
guide recesses formed between the pair of outer fingers and the pair of inner fingers to prevent interference with the support pins.

* * * * *